(12) United States Patent
Imura

(10) Patent No.: US 10,238,020 B2
(45) Date of Patent: Mar. 19, 2019

(54) COMPONENT MOUNTING MACHINE

(71) Applicant: FUJI MACHINE MFG. CO., LTD., Chiryu-shi (JP)

(72) Inventor: Jinya Imura, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 371 days.

(21) Appl. No.: 14/895,826

(22) PCT Filed: Jul. 12, 2013

(86) PCT No.: PCT/JP2013/069171
§ 371 (c)(1),
(2) Date: Dec. 3, 2015

(87) PCT Pub. No.: WO2015/004804
PCT Pub. Date: Jan. 15, 2015

(65) Prior Publication Data
US 2016/0113165 A1    Apr. 21, 2016

(51) Int. Cl.
*H05K 13/04* (2006.01)

(52) U.S. Cl.
CPC ..... *H05K 13/0408* (2013.01); *H05K 13/0409* (2018.08); *Y10T 29/53174* (2015.01); *Y10T 29/53178* (2015.01)

(58) Field of Classification Search
CPC ............... H05K 13/04; H05K 13/0404; H05K 13/0408; H05K 13/043; H05K 13/08; Y10T 29/5313; Y10T 29/53174; Y10T 29/53178; Y10T 29/53191

USPC ........................................................ 29/743
See application file for complete search history.

(56) References Cited

U.S. PATENT DOCUMENTS

| 6,515,828 | B1 | 2/2003 | Ashikawa |
| 2003/0014862 | A1 | 1/2003 | Suhara et al. |
| 2006/0053624 | A1 | 3/2006 | Maeda et al. |
| 2010/0229380 | A1* | 9/2010 | Endo ................. H05K 13/0452 29/760 |

FOREIGN PATENT DOCUMENTS

| CN | 1290396 A | 4/2001 |
| JP | 2000-114786 A | 4/2000 |

(Continued)

OTHER PUBLICATIONS

Machine translation of description section of JP 2000-114786 provided by EPO website (Espacenet.com).*

(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

A positive pressure command value which is appropriate for releasing a component is registered in component data, and a control device of a component mounting machine obtains the positive pressure command value to be used in releasing the component suctioned to the suction nozzle, and adjusts output positive pressure of the electropneumatic proportional valve by outputting the positive pressure command value to the electropneumatic proportional valve, with reference to the component data of the component suctioned to the suction nozzle.

4 Claims, 5 Drawing Sheets

(56) References Cited

FOREIGN PATENT DOCUMENTS

| JP | 2000-151192 A | 5/2000 |
|---|---|---|
| JP | 2004-158760 A | 6/2004 |
| JP | 2008-4793 A | 1/2008 |
| JP | 2008-226978 A | 9/2008 |
| JP | 2010-114378 A | 5/2010 |

OTHER PUBLICATIONS

Machine translation of description section of JP 2008-226978 provided by EPO website (Espacenet.com).*
International Search Report dated Oct. 15, 2013 in PCT/JP13/069171 Filed Jul. 12, 2013.
Extended European Search Report dated Jun. 21, 2016 in Patent Application No. 13889014.0.
English translation of Office Action dated Oct. 31, 2016 in Japanese Patent Application No. 2015-526122.
Japanese Office Action dated Jun. 2, 2017 in Patent Application No. 2015-526122 (with English Translation).
Combined Office Action and Search Report dated Nov. 3, 2017 in Chinese Patent Application No. 201380078077.4 (with English language translation and English translation of categories of cited documents).
Chinese Office Action dated Apr. 16, 2018 in Patent Application No. 201380078077.4 (with English translation), 7 pages.
Chinese Decision of Rejection dated Sep. 5, 2018 for Chinese Application No. 201380078077.4, and English translation thereof.

* cited by examiner

[Fig.1]
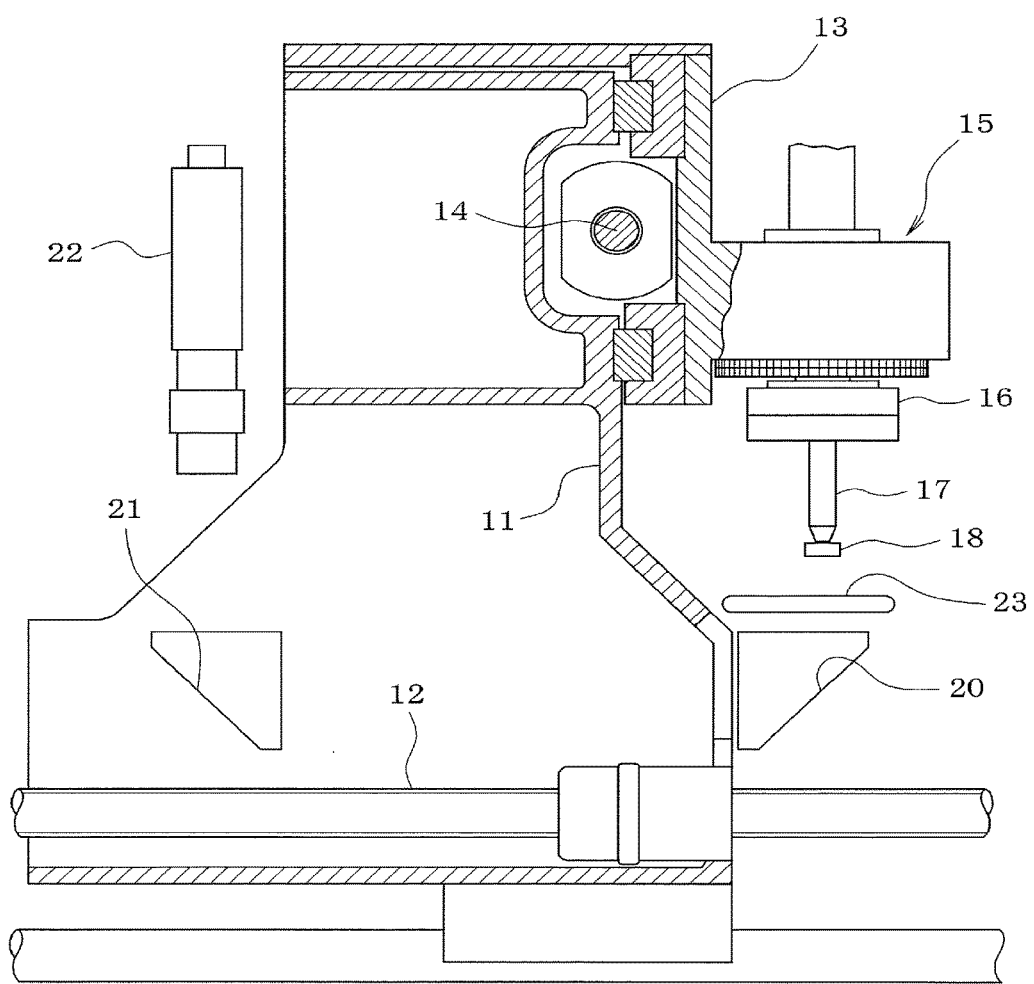

[Fig.2]
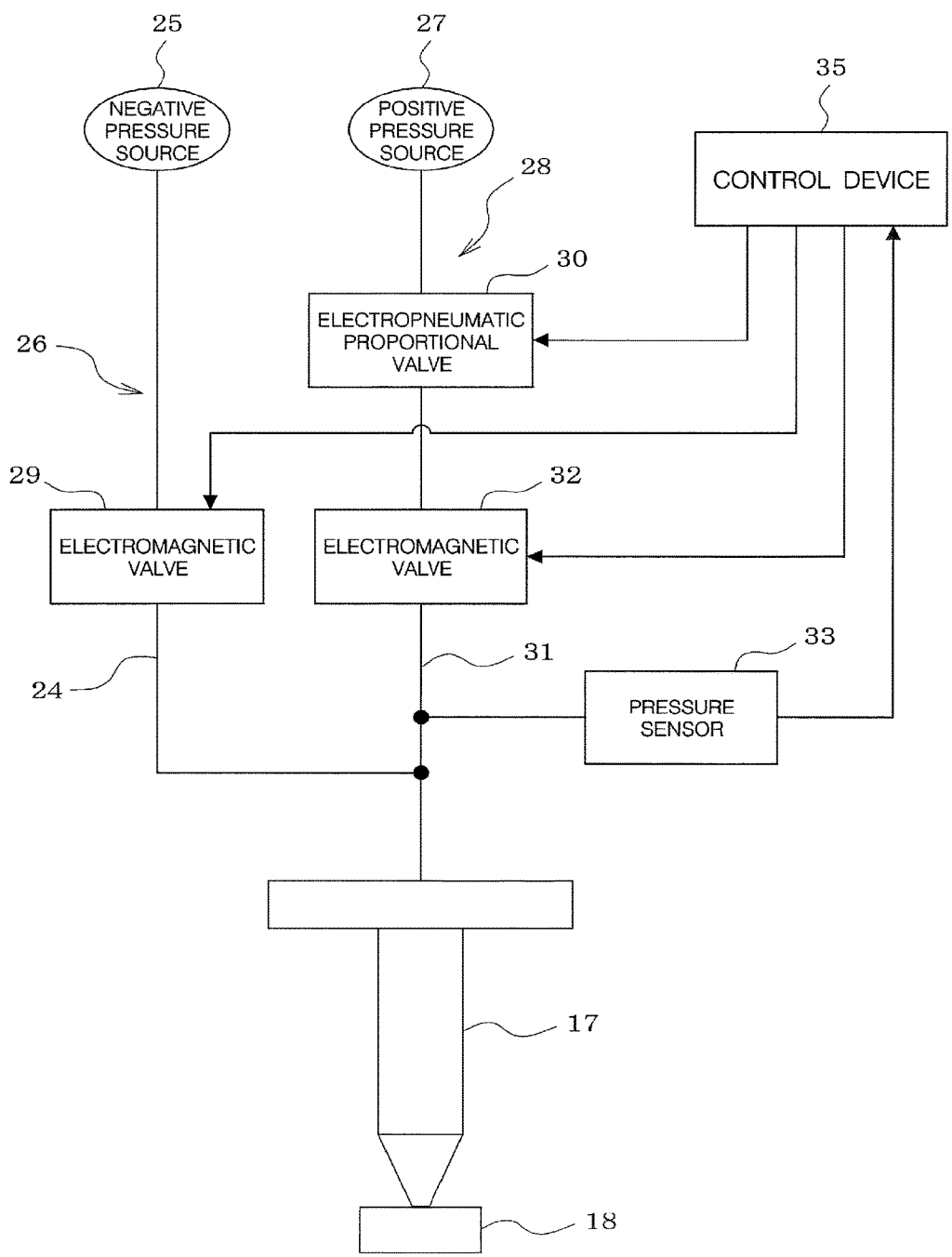

[Fig.3]
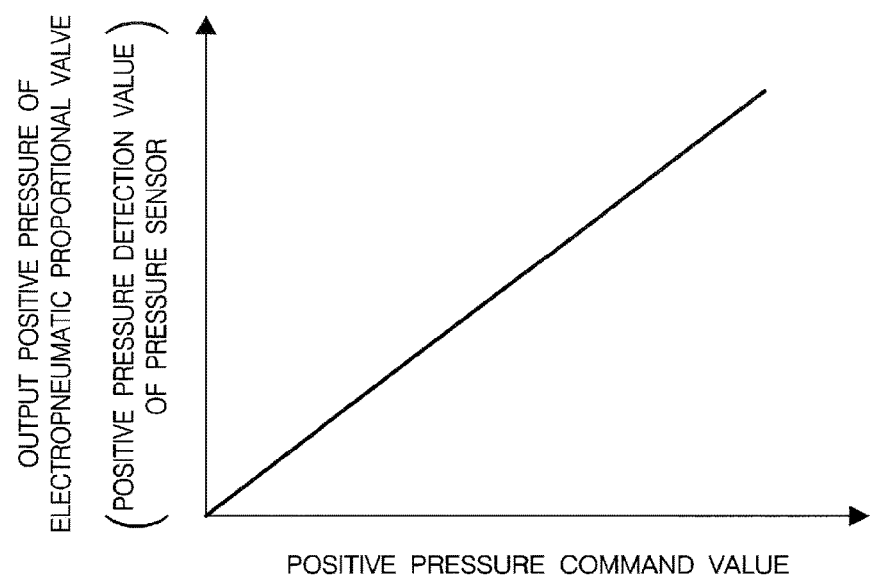

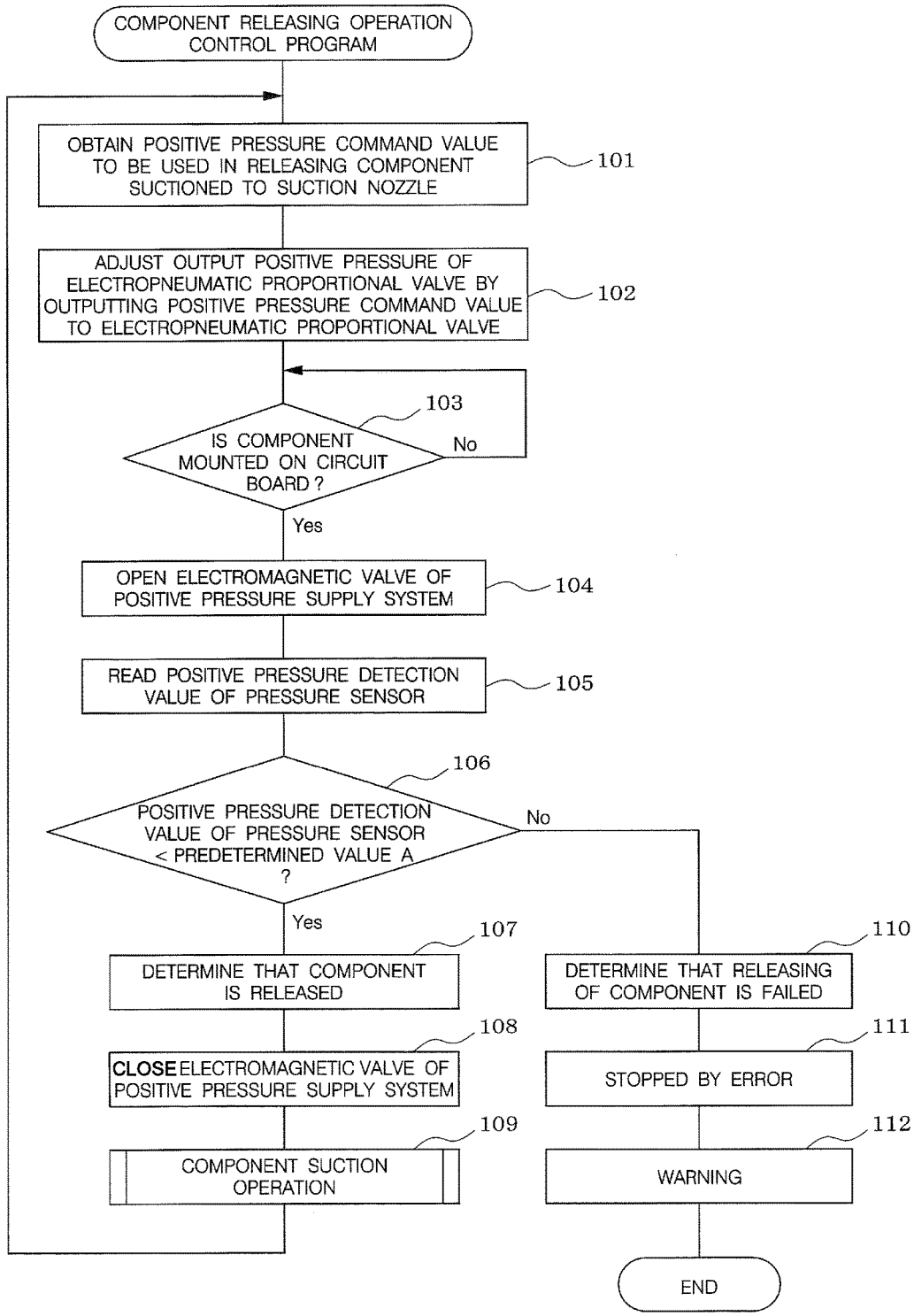
[Fig.4]

[Fig.5]
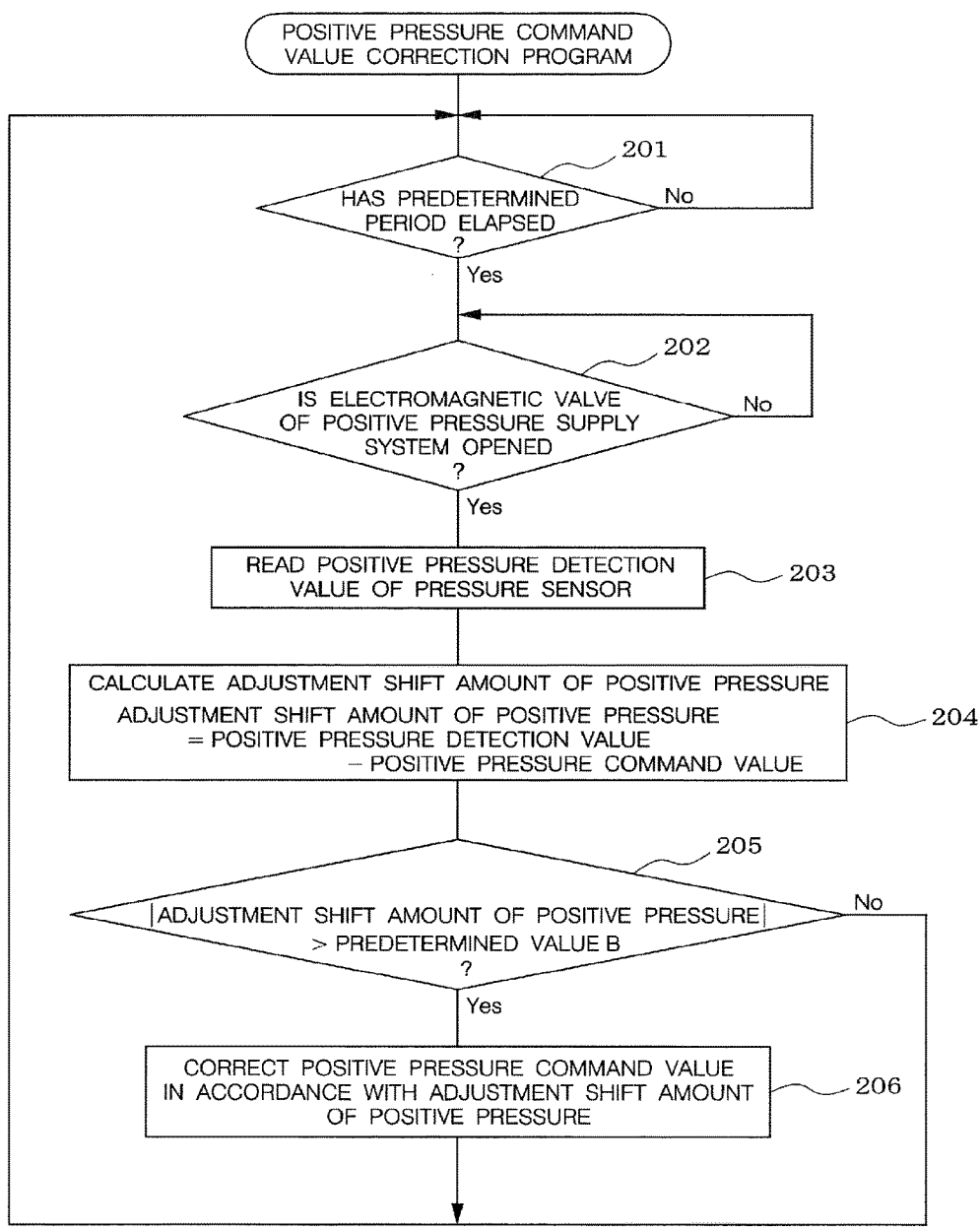

COMPONENT MOUNTING MACHINE

TECHNICAL FIELD

The present disclosure relates to a component mounting machine which releases a component by supplying positive pressure (vacuum breaking pressure) from a positive pressure source to a suction nozzle which sucks the component by negative pressure.

BACKGROUND ART

In the related art, in a component mounting machine, as described in PTL 1 (JP-A-2010-114378), after suctioning a component supplied from a feeder to a suction nozzle by negative pressure and mounting the component onto a circuit board, by supplying positive pressure (vacuum breaking pressure) to the suction nozzle from a positive pressure source and releasing a negative pressure suctioning force, the component suctioned to the suction nozzle is released, and then, by repeating an operation of returning the suction nozzle to a position above the feeder and suctioning the component to the suction nozzle, a component mounting board is produced.

CITATION LIST

Patent Literature

PTL 1: JP-A-2010-114378

SUMMARY

Technical Problem

However, in the component suctioned to the suction nozzle, there are various types of components which have different shapes, sizes, and weights, but when the component suctioned to the suction nozzle is released, since the positive pressure supplied to the suction nozzle from the positive pressure source is constant, there is a possibility that the positive pressure is not sufficient according to the component, the component cannot be released from the suction nozzle, and the component is taken back while being attached to the suction nozzle, due to static electricity or the like, or in contrast, there is a possibility that the positive pressure is too high according to the component, and a mounting position of the peripheral component on the circuit board is shifted by the positive pressure blown out from the suction nozzle. This causes deterioration of reliability in mounting.

Here, in order to solve the problem by the present disclosure, there is provided a component mounting machine in which a function of supplying positive pressure which is appropriate for the component suctioned to the suction nozzle, to the suction nozzle, and releasing the component, can be embedded at a low cost.

Solution to Problem

In order to solve the above-described problem, the present disclosure is configured to provide a component mounting machine which releases a component by supplying positive pressure (vacuum breaking pressure) from a positive pressure source to a suction nozzle that sucks the component by negative pressure, the component mounting machine including: an electropneumatic proportional valve which adjusts the positive pressure supplied to the suction nozzle from the positive pressure source; an electromagnetic valve which opens and closes a positive pressure supply path between the electropneumatic proportional valve and the suction nozzle; and control device for controlling a positive pressure adjustment operation of the electropneumatic proportional valve and an opening/closing operation of the electromagnetic valve, in which the control device adjusts output positive pressure of the electropneumatic proportional valve to the positive pressure which is appropriate for releasing the component, for every component suctioned to the suction nozzle.

In this configuration, the positive pressure supplied to the suction nozzle can be adjusted by the electropneumatic proportional valve when releasing the component. For this reason, it is possible to provide the mounting machine with a function of adjusting the positive pressure supplied to the suction nozzle to the positive pressure which is appropriate for releasing the component for every component suctioned to the suction nozzle, on the component mounting machine at low cost, and at the same time, it is possible to prevent a releasing defect of the component (taking back of the component) due to insufficient positive pressure or a shift of the mounting position of the component due to excessive positive pressure, which is a problem of the related art, by optimizing the positive pressure supplied to the suction nozzle for every component by the size, the shape, and the weight of the component, in advance.

The present disclosure may create a dedicated database which sets a command value of the positive pressure which is appropriate for releasing the component for every component, but in the component mounting machine, considering that the component data including the image processing data to be used when processing the image of the component suctioned to the suction nozzle is used, the positive pressure command value which is appropriate for releasing the component is registered in the component data, and the control device may obtain the positive pressure command value to be used in releasing the component suctioned to the suction nozzle, and adjust the output positive pressure of the electropneumatic proportional valve by outputting the positive pressure command value to the electropneumatic proportional valve, with reference to the component data. In this manner, it is possible to manage the positive pressure command value for every component in association with the component by using the existing component data, and it is easy to manage the positive pressure command value.

In this case, considering that there is the possibility of deterioration of a positive pressure supply system, including the positive pressure source or the electropneumatic proportional valve due to aging or the like, and a shift of the positive pressure supplied to the suction nozzle, a pressure sensor which detects the positive pressure supplied to the suction nozzle through the positive pressure supply path from the electropneumatic proportional valve when opening the electromagnetic valve (when releasing the component) may be provided, and, by comparing the positive pressure detected by the pressure sensor with the positive pressure command value when supplying the positive pressure to the suction nozzle, the control device may correct the positive pressure command value in accordance with the comparison result. In this manner, it is ascertained by what amount the positive pressure supplied to the suction nozzle is shifted from the positive pressure command value from the comparison result between the positive pressure detection value of the pressure sensor and the positive pressure command value when the positive pressure supply system deteriorates due to aging or the like and the positive pressure supplied to the suction nozzle is shifted. Therefore, by correcting the positive pressure command value in accordance with the amount of the shift, it is possible to adjust the positive pressure supplied to the suction nozzle to the positive pressure which is appropriate for releasing the component, and to correct the adjustment shift of the positive pressure due to aging or the like of the positive pressure supply system at any time. Furthermore, it is not necessary to perform the processing of correcting the positive pressure command value by comparing the positive pressure detection value of the pressure sensor and the positive pressure command value each time a component is released the component, and the processing may be performed once when a predetermined period of time has elapsed, each time a number of releasing of the component (the number of opening of the electromagnetic valve) reaches a predetermined number, or when an operation of the component mounting machine is started.

Furthermore, the control device may determine whether or not the component is released from the suction nozzle based on a lowering behavior of the positive pressure detected by the pressure sensor when supplying the positive pressure to the suction nozzle. Since a suction hole of the suction nozzle at the moment when the component is released from the suction nozzle communicates with the atmosphere and the positive pressure detection value of the pressure sensor is rapidly decreased to be close to the pressure of the atmosphere, it is possible to detect timing when the component is released from the suction nozzle with high accuracy by detecting the rapid decrease of the positive pressure detection value of the pressure sensor. Accordingly, it is possible to efficiently use the pressure sensor both in revising the output positive pressure of the electropneumatic proportional valve and determining the timing of component release.

BRIEF DESCRIPTION OF DRAWINGS

FIG. 1 is a longitudinal sectional view illustrating a configuration of a component mounting machine of an embodiment of the present invention.

FIG. 2 is a block diagram illustrating a configuration of a positive pressure supply system.

FIG. 3 is a view illustrating a relationship between a positive pressure command value and output positive pressure of an electropneumatic proportional valve.

FIG. 4 is a flowchart illustrating a flow of processing of a component releasing operation control program.

FIG. 5 is a flowchart illustrating a flow of processing of a positive pressure command value correction program.

DESCRIPTION OF EMBODIMENTS

Hereinafter, an embodiment which specifies an aspect for realizing the present disclosure will be described. First, a schematic configuration of the entire component mounting machine will be described using FIG. 1.

An X-axis slide 11 is provided to slidably move in an X-axis direction (horizontal direction of FIG. 1) by an X-axis ball screw 12, and a Y-axis slide 13 is provided to slidably move in a Y-axis direction (paper surface perpendicular direction of FIG. 1) by a Y-axis ball screw 14 with respect to the X-axis slide 11.

A mounting head 15 is provided in the Y-axis slide 13, a nozzle holder 16 is provided to be capable of being raised and lowered in a Z-axis direction (vertical direction) via a Z-axis driving mechanism (not illustrated) in the mounting head 15, and a suction nozzle 17 is attached to the nozzle holder 16 in a downward direction to be replaceable.

Meanwhile, a component confirming camera (parts camera) 22 which images a component 18 suctioned to the suction nozzle 17 via one pair of reflecting mirrors 20 and 21 from a lower surface side is provided in the X-axis slide 11. Above the reflecting mirror 20 which is positioned below the component 18 suctioned to the suction nozzle 17, a ring-shaped front light 23 is provided as an illuminated light source which illuminates the component 18 suctioned to the suction nozzle 17 from the lower surface side thereof.

As illustrated in FIG. 2, a negative pressure supply system 26 which supplies negative pressure from a negative pressure source 25, and a positive pressure supply system 28 which supplies positive pressure from a positive pressure source 27 are connected to a suction hole of the suction nozzle 17. In the negative pressure supply system 26, an electromagnetic valve 29 which opens and closes a negative pressure supply path 24 is provided, and when the component 18 is suctioned to the suction nozzle 17, the electromagnetic valve 29 is opened and the negative pressure is supplied to the suction nozzle 17. In the positive pressure supply system 28, an electropneumatic proportional valve 30 (is called as an electropneumatic regulator or a proportional control valve) which adjusts the positive pressure supplied to the suction nozzle 17, and an electromagnetic valve 32 which opens and closes a positive pressure supply path 31 between the electropneumatic proportional valve 30 and the suction nozzle 17, are provided. When releasing the component 18 suctioned to the suction nozzle 17 by the negative pressure, the electromagnetic valve 32 is opened, and the positive pressure adjusted by the electropneumatic proportional valve 30 is supplied to the suction nozzle 17. In the positive pressure supply path 31 on a downstream side of the electromagnetic valve 32, a pressure sensor 33 which detects the positive pressure supplied to the suction nozzle 17 when opening the electromagnetic valve 32 (when releasing the component 18), is provided.

A control device 35 of the component mounting machine controls an opening/closing operation of the electromagnetic valve 29 of the negative pressure supply system 26, and controls a positive pressure adjusting operation of the electropneumatic proportional valve 30 of the positive pressure supply system 28 and an opening/closing operation of the electromagnetic valve 32. Furthermore, the control device 35 detects the positive pressure supplied to the suction nozzle 17 by reading an output signal of the pressure sensor 33 when opening the electromagnetic valve 32 (when releasing the component 18).

However, concerning the component 18 suctioned to the suction nozzle 17, various types of components having different shapes, sizes, and weight, are present. Therefore, when releasing the component 18 suctioned to the suction nozzle 17, similar to the related art, there is a possibility that, if the positive pressure supplied to the suction nozzle 17 from the positive pressure source 27 is constant, the positive pressure is not sufficient by the component 18, and the component 18 cannot be released from the suction nozzle 17 and the component 18 is taken back while being attached to the suction nozzle 17 due to static electricity or the like, or in contrast, the positive pressure is too high according to the component 18 and a mounting position of the component in the periphery on a circuit board is shifted by the positive pressure blown out of the suction nozzle 17.

Here, the control device 35 of the component mounting machine adjusts output positive pressure of the electropneumatic proportional valve 30 to the positive pressure which is appropriate for releasing the component 18 for every component 18 suctioned to the suction nozzle 17. In the embodiment, a relationship (refer to FIG. 3) between a positive pressure command value to the electropneumatic proportional valve 30 before production and the output positive pressure of the electropneumatic proportional valve 30 is measured, and the measured relationship is stored in a memory of the control device 35 as calibration data. In a measuring method of the calibration data, a calibration nozzle (a nozzle in which the positive pressure does not leak) in which the suction hole is blocked is attached to the mounting head 15, the positive pressure command value to the electropneumatic proportional valve 30 is increased in order from the minimum value to the maximum value, the output positive pressure of the electropneumatic proportional valve 30 is measured by the pressure sensor 33 every time when the positive pressure command value is increased, and the calibration data of the relationship between the positive pressure command value to the electropneumatic proportional valve 30 and the positive pressure detection value of the pressure sensor 33 is obtained.

In this case, a dedicated database which sets the command value of the positive pressure which is appropriate for releasing the component 18 may be created for every component 18, but in the component mounting machine, considering that the component data including the image processing data to be used when processing the image of the component 18 suctioned to the suction nozzle 17 is used, the positive pressure command value which is appropriate for releasing the component 18 is registered in the component data, and the control device 35 may obtain the positive pressure command value to be used in releasing the component 18 suctioned to the suction nozzle 17, and adjust the output positive pressure of the electropneumatic proportional valve 30 by outputting the positive pressure command value to the electropneumatic proportional valve 30, with reference to the component data of the component 18 suctioned to the suction nozzle 17. Based on the relationship between the positive pressure command value and the positive pressure detection value of the pressure sensor 33, as the positive pressure command value which is appropriate for releasing the component 18, a calibrated value is used so that the positive pressure supplied to the suction nozzle 17 becomes a target positive pressure.

Furthermore, in the embodiment, considering that there is the possibility of deterioration of the positive pressure supply system 28 due to aging or the like and the shift of the positive pressure supplied to the suction nozzle 17, comparing the positive pressure detected by the pressure sensor 33 with the positive pressure command value (target positive pressure) when supplying the positive pressure to the suction nozzle 17, the control device 35 may correct the positive pressure command value in accordance with the comparison result. In this manner, when the positive pressure supply system 28 deteriorates due to aging or the like and the positive pressure supplied to the suction nozzle 17 is shifted, it is ascertained by what amount the positive pressure supplied to the suction nozzle 17 is shifted from the positive pressure command value from the comparison result between the positive pressure detection value of the pressure sensor 17 and the positive pressure command value. Therefore, by correcting the positive pressure command value in accordance with the amount of the shift, it is possible to adjust the positive pressure supplied to the suction nozzle 17 to the positive pressure which is appropriate for releasing the component, and to correct the adjustment shift of the positive pressure due to aging or the like of the positive pressure supply system 28 at any time. Furthermore, it is not necessary to perform the processing of correcting the positive pressure command value by comparing the positive pressure detection value of the pressure sensor 33 and the positive pressure command value each time a component is released, and the processing may be performed once when a predetermined period of time has elapsed, each time a number of releasing of the component (the number of opening of the electromagnetic valve 32) reaches a predetermined number, or when the operation of the component mounting machine is started.

In addition, in the embodiment, the control device 35 determines whether or not the component 18 is released from the suction nozzle 17 based on a lowering behavior of the positive pressure detected by the pressure sensor 33 when supplying the positive pressure to the suction nozzle 17. Since the suction hole of the suction nozzle 17 communicates with the atmosphere and the positive pressure detection value of the pressure sensor 33 is rapidly decreased to be close to the pressure of the atmosphere at the moment when the component 18 is released from the suction nozzle 17, it is possible to detect the timing at which the component 18 is released from the suction nozzle 17 with high accuracy by detecting the rapid decrease of the positive pressure detection value of the pressure sensor 33. Accordingly, it is possible to efficiently use the pressure sensor 33 both in revising the output positive pressure of the electropneumatic proportional valve 30 and determining the component releasing timing.

The control of the component releasing operation and the correction of the positive pressure command value based on the positive pressure detection value of the pressure sensor 33 of the above-described embodiment, are performed according to a component releasing operation control program of FIG. 4 and a positive pressure command value correction program of FIG. 5 by the control device 35. Hereinafter, the contents of the processing of each program will be described.

Component Releasing Operation Control Program

When an operation of the component releasing operation control program of FIG. 4 is started, first, in step 101, the positive pressure command value to be used in releasing the component 18 is obtained with reference to the component data of the component 18 suctioned to the suction nozzle 17. After this, the process advances to step 102, and the positive pressure command value is output to the electropneumatic proportional valve 30 and the output positive pressure of the electropneumatic proportional valve 30 is adjusted.

In addition, in the following step 103, it is determined whether or not the component 18 suctioned to the suction nozzle 17 is mounted on the circuit board, and if the component 18 has not been mounted yet, a stand-by state is maintained until the component 18 is mounted. After this, at the moment when the component 18 is mounted on the circuit board, the process advances to step 104, the electromagnetic valve 32 of the positive pressure supply system 28 is opened, and the positive pressure adjusted by the electropneumatic proportional valve 30 is supplied to the suction nozzle 17. Accordingly, the component 18 is released from the suction nozzle 17.

After this, the process advances to step 105, the positive pressure detection value of the pressure sensor 33 is read, and in the following step 106, it is determined whether or not the pressure of the suction hole of the suction nozzle 17 is decreased to be close to the pressure of atmosphere (that is, whether or not the component 18 is released from the suction nozzle 17) based on whether or not the positive pressure detection value of the pressure sensor 33 is less than a predetermined value A. Here, the predetermined value A is set to be pressure between the positive pressure supplied to the suction nozzle 17 and the pressure of atmosphere.

In step 106, if it is determined that the positive pressure detection value of the pressure sensor 33 is less than the predetermined value A, the process advances to step 107, it is determined that the component 18 is released from the suction nozzle 17, and in the following step 108, the electromagnetic valve 32 of the positive pressure supply system 28 is closed. After this, the process advances to step 109, a component suction operation program (not illustrated) is executed, the following component 18 is suctioned to the suction nozzle 17, the process returns to the above-described step 101, and the above-described processing is repeated.

In contrast to this, in the above step 106, if it is determined that the positive pressure detection value of the pressure sensor 33 is equal to or greater than the predetermined value A, the process advances to step 110, and it is determined that the releasing of the component 18 from the suction nozzle 17 has failed. In this case, the process advances to step 111, the component mounting machine is stopped by an error, and in the following step 112, the operator is notified of the failure to release the component 18 by a display or a sound, and the program is ended.

[Positive Pressure Command Value Correction Program]

When the positive pressure command value correction program of FIG. 5 is started to be operated, first, in step 201, it is determined whether or not a predetermined period during which there is a possibility that the shift of the positive pressure is generated due to aging or the like of the positive pressure supply system 28 has elapsed, and if the predetermined period has not elapsed, a stand-by state is maintained until the predetermined time elapses. After this, at the moment when the predetermined period elapsed, the process advances to step 202, it is determined whether or not the electromagnetic valve 32 of the positive pressure supply system 28 is opened, and if the electromagnetic valve 32 is not opened, a stand-by state is maintained until the electromagnetic valve 32 is opened.

After this, at the moment when the electromagnetic valve 32 is opened, the process advances to step 203, the positive pressure detection value of the pressure sensor 33 is read, and in the following step 204, comparing the positive pressure detection value of the pressure sensor 33 with the positive pressure command value, an adjustment shift amount of the positive pressure is calculated by the following equation.

$$\text{adjustment shift amount of positive pressure} = \text{positive pressure detection value} - \text{positive pressure command value}$$

Here, the positive pressure command value is a value converted to a measure of pressure, and is a value obtained by combining the positive pressure detection value and a unit.

After this, the process advances to step 205, and it is determined whether or not the absolute value of the adjustment shift amount of the positive pressure is greater than a predetermined value B. As a result, if it is determined that the absolute value of the adjustment shift amount of the positive pressure is greater than the predetermined value B, it is determined that it is necessary to correct the shift of the positive pressure command value, the process advances to step 206, the positive pressure command value is corrected in accordance with the adjustment shift amount of the positive pressure by using the calibration data of FIG. 3, and the positive pressure command value included in the component data is updated and registered. Then, returning to the above-described step 201, the above-described processing is repeated.

Meanwhile, in the above-described step 205, if it is determined that the absolute value of the adjustment shift amount of the positive pressure is equal to or less than the predetermined value B, it is determined that the adjustment shift amount of the positive pressure is small and it is not necessary to correct the shift of the positive pressure command value, and returning to the above-described step 201, the above-described processing is repeated.

According to the above-described embodiment, since the positive pressure supplied to the suction nozzle 17 when releasing the component can be adjusted by the electropneumatic proportional valve 30, it is possible to provide the component mounting machine with the function of adjusting the positive pressure supplied to the suction nozzle 17 to the positive pressure which is appropriate for releasing the component 18 for every component 18 suctioned to the suction nozzle 17 at low cost, and to prevent a releasing defect of the component 18 (taking back of the component) due to insufficient positive pressure or a shift of the mounting position of the component on the circuit board due to excessive positive pressure, which is a problem of the related art, by optimizing the positive pressure supplied to the suction nozzle 17 for every component 18.

However, by setting the most appropriate positive pressure for every component 18 suctioned to the suction nozzle 17, it is possible to minimize the time which is necessary in releasing the component 18 for every component 18, and to improve cycle time (throughput).

Furthermore, in the above-described embodiment, only one suction nozzle 17 is held by the mounting head 15, but the present disclosure can also be employed and realized in a component mounting machine in which a plurality of suction nozzles are held by the mounting head.

In addition, it is needless to say that the present disclosure can be realized being changed in various manners without departing the main idea, for example, the configuration of the component mounting machine may be appropriately changed.

REFERENCE SIGNS LIST

15 . . . mounting head, 17 . . . suction nozzle, 18 . . . component, 24 . . . negative pressure supply path, 25 . . . negative pressure source, 26 . . . negative pressure supply system, 27 . . . positive pressure source, 28 . . . positive pressure supply system, 29 . . . electromagnetic valve, 30 . . . electropneumatic proportional valve, 31 . . . positive pressure supply path, 32 . . . electromagnetic valve, 33 . . . pressure sensor, 35 . . . control device (control means).

The invention claimed is:

1. A component mounting machine which releases a component by supplying positive pressure from a positive pressure source to a suction nozzle that sucks a component by negative pressure, the component mounting machine comprising:

an electropneumatic proportional valve which adjusts the positive pressure supplied to the suction nozzle from the positive pressure source;

an electromagnetic valve which opens and closes a positive pressure supply path between the electropneumatic proportional valve and the suction nozzle;

a control device configured to control a positive pressure adjustment operation of the electropneumatic proportional valve and an opening/closing operation of the electromagnetic valve; and a pressure sensor which detects the positive pressure supplied to the suction nozzle through the positive pressure supply path from the electropneumatic proportional valve when opening the electromagnetic valve, wherein the control device adjusts output positive pressure of the electropneumatic proportional valve to a positive pressure to release the component from the suction nozzle and the control device determines that the component is released from the suction nozzle when the pressure sensor detects that the pressure in the positive pressure supply path is less than a predetermined value, and wherein the control device determines that the release of the component from the suction nozzle has failed when the pressure sensor detects that the pressure in the positive pressure supply path is greater than or equal to the predetermined value after the electropneumatic proportional valve is adjusted to the positive pressure.

2. The component mounting machine according to claim 1, wherein a positive pressure command value which is appropriate for releasing the component is registered in component data including data for image processing to be used when an image of the component suctioned to the suction nozzle is processed, and wherein the control device obtains the positive pressure command value to be used in releasing the component suctioned to the suction nozzle, and adjusts the output positive pressure of the electropneumatic proportional valve by outputting the positive pressure command value to the electropneumatic proportional valve, with reference to the component data.

3. The component mounting machine according to claim 2, wherein, comparing the positive pressure detected by the pressure sensor with the positive pressure command value when supplying the positive pressure to the suction nozzle, the control device corrects the positive pressure command value in accordance with the comparison result.

4. The component mounting machine according to claim 1, wherein the predetermined value is a pressure between the positive pressure supplied from the positive pressure source and atmosphere pressure.

* * * * *

UNITED STATES PATENT AND TRADEMARK OFFICE
CERTIFICATE OF CORRECTION

PATENT NO. : 10,238,020 B2
APPLICATION NO. : 14/895826
DATED : March 19, 2019
INVENTOR(S) : Jinya Imura Page 1 of 1

It is certified that error appears in the above-identified patent and that said Letters Patent is hereby corrected as shown below:

On the Title Page

Item (71), the Applicant's information is incorrect. Item (71) should read:
-- (71) Applicant: FUJI CORPORATION, Chiryu-shi (JP) --

Signed and Sealed this
Eighteenth Day of June, 2019

Andrei Iancu
*Director of the United States Patent and Trademark Office*